United States Patent
Wu

(10) Patent No.: US 11,963,314 B2
(45) Date of Patent: Apr. 16, 2024

(54) FLEXIBLE DISPLAY DEVICE

(71) Applicant: InnoLux Corporation, Miao-Li County (TW)

(72) Inventor: Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 3 days.

(21) Appl. No.: 17/866,570

(22) Filed: Jul. 18, 2022

(65) Prior Publication Data
US 2023/0046408 A1 Feb. 16, 2023

(30) Foreign Application Priority Data
Aug. 16, 2021 (CN) .......................... 202110936735.5

(51) Int. Cl.
*H05K 5/00* (2006.01)
*G06F 1/16* (2006.01)
*H05K 5/02* (2006.01)

(52) U.S. Cl.
CPC ......... *H05K 5/0018* (2022.08); *G06F 1/1637* (2013.01); *G06F 1/1652* (2013.01); *H05K 5/0217* (2013.01)

(58) Field of Classification Search
CPC ... G06F 1/1637; G06F 1/1652; H05K 5/0217; H05K 5/0018; H05K 5/0017
See application file for complete search history.

(56) References Cited

U.S. PATENT DOCUMENTS

| | | | | |
|---|---|---|---|---|
| 9,989,995 | B2* | 6/2018 | Kwak | G06F 1/1637 |
| 10,527,877 | B2* | 1/2020 | Ochi | H04M 1/0266 |
| 10,903,445 | B2* | 1/2021 | Baek | G06F 3/041 |
| 2015/0334211 | A1* | 11/2015 | Shin | G06F 1/1637 |
| | | | | 455/566 |
| 2016/0066440 | A1* | 3/2016 | Choi | G06F 1/1601 |
| | | | | 361/679.3 |
| 2018/0088631 | A1* | 3/2018 | Park | H10K 50/844 |
| 2019/0081255 | A1* | 3/2019 | Kim | B32B 3/04 |
| 2019/0296259 | A1 | 9/2019 | Baek | |
| 2020/0413559 | A1* | 12/2020 | Lee | H05K 1/189 |
| 2021/0168231 | A1* | 6/2021 | Baker | H04M 1/0266 |
| 2022/0061166 | A1* | 2/2022 | Burke | H05K 5/03 |
| 2022/0232711 | A1* | 7/2022 | Naito | G06F 1/1624 |
| 2022/0236457 | A1* | 7/2022 | Hwang | B32B 17/10 |

FOREIGN PATENT DOCUMENTS

| CN | 111105718 A | 5/2020 |
|---|---|---|
| EP | 3 176 671 A1 | 6/2017 |

* cited by examiner

*Primary Examiner* — Sagar Shrestha
(74) *Attorney, Agent, or Firm* — Winston Hsu

(57) ABSTRACT

A flexible display device is disclosed. The flexible display device includes a flexible substrate, a display structure, a protective structure and an adhesive. The display structure is disposed on the flexible substrate. The protective structure is disposed on the display structure and forms a first accommodating space. The adhesive is disposed in the first accommodating space.

14 Claims, 7 Drawing Sheets

FLEXIBLE DISPLAY DEVICE

BACKGROUND OF THE DISCLOSURE

1. Field of the Disclosure

The present disclosure relates to a flexible display device, and more particularly to a flexible display device which is rollable.

2. Description of the Prior Art

In recent years, rollable display devices or deformable display devices have become one of the focuses of the new generation of electronic technology. Generally, the area of the display region of a rollable display device or a deformable display device can be changed by being rolled-up, but the stress generated during the expanding and/or folding of its structure may affect the display performance or cause the display device to be damaged, so there is a need to develop suitable designs of the structure to improve the reliability of the rollable display device.

SUMMARY OF THE DISCLOSURE

An embodiment of the present disclosure provides a flexible display device. The flexible display device includes a flexible substrate, a display structure, a protective structure and an adhesive. The display structure is disposed on the flexible substrate. The protective structure is disposed on the display structure and forms a first accommodating space. The adhesive is disposed in the first accommodating space.

These and other objectives of the present disclosure will no doubt become obvious to those of ordinary skill in the art after reading the following detailed description of the embodiment that is illustrated in the various figures and drawings.

DETAILED DESCRIPTION

Figure 1:
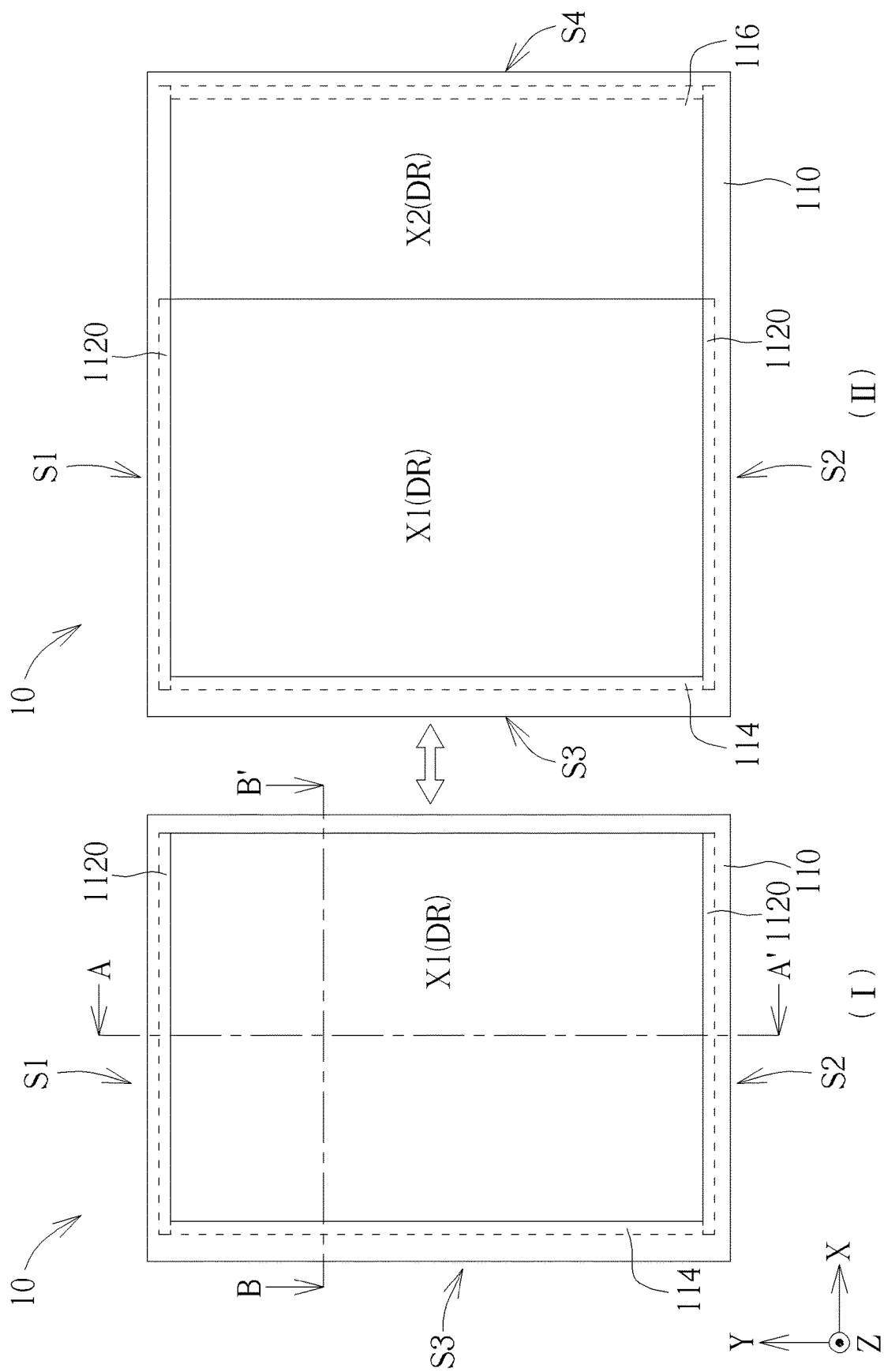
FIG. 1 is a top-view schematic diagram of a flexible display device in different statuses according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device or the structure, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

The directional terms mentioned in this document, such as "up", "down", "front", "back", "left", "right", etc., are only directions referring to the drawings. Therefore, the directional terms used are for illustration, not for limitation of the present disclosure. In the drawings, each drawing shows the general characteristics of methods, structures and/or materials used in specific embodiments. However, these drawings should not be interpreted as defining or limiting the scope or nature covered by these embodiments. For example, the relative size, thickness and position of each layer, area and/or structure may be reduced or enlarged for clarity.

It should be understood that when an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented. In addition, the arrangement of different elements may be interpreted according to the contents of the drawings.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

The electronic device of the present disclosure may include a display device, an antenna device, a touch display, a curved display or a free shape display, but not limited herein. The electronic device may be a bendable, flexible or rollable electronic device. The electronic device may include light-emitting diodes, liquid crystals, fluorescence, phosphors, other suitable display media or combinations of the above, but not limited herein. The light-emitting diodes may, for example, include organic light-emitting diodes (OLEDs), inorganic light-emitting diodes (LEDs), mini-light-emitting diodes (mini LEDs, millimeter sized LEDs), micro-light-emitting diodes (micro-LEDs, micrometer sized LEDs), quantum dots (QDs) light-emitting diodes (e.g. QLEDs or QDLEDs), other suitable light-emitting diodes or any arrangement and combination of the above, but not limited herein. The display device may include, for example, a tiled display device, but not limited herein.

The antenna device may be, for example, a liquid crystal antenna or other types of antennas, but not limited herein. The antenna device may include, for example, a tiled antenna device, but not limited herein. It should be noted that, the electronic device may be any arrangement and combination of the devices describe above, but not limited herein. In addition, the appearance of the electronic device may be rectangular, circular, polygonal, a shape with curved edges or other suitable shapes. The electronic device may have external systems such as a driving system, a control system, a light source system, a shelf system, etc. to support a display device, an antenna device or a tiled device. In the following, a display device will be used as the electronic device to illustrate the contents of the present disclosure, but the present disclosure is not limited herein.

Figure 2:
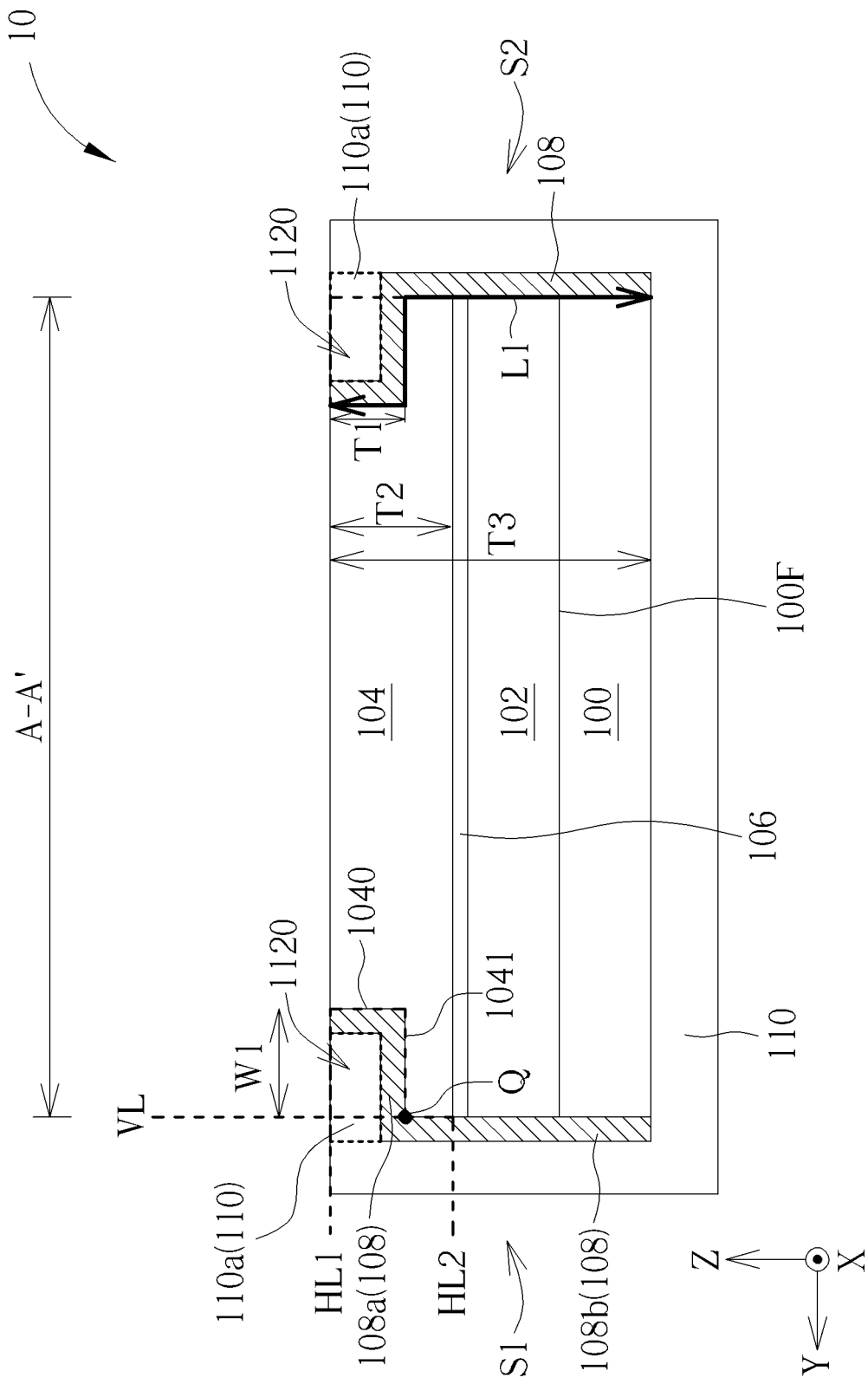
FIG. 2 is a cross-sectional view schematic diagram of the flexible display device of FIG. 1 along a section line A-A'.

A direction X, a direction Y and a direction Z are labeled in the following drawings. The direction Z may be perpendicular to a surface 100F (as shown in FIG. 2) of a flexible substrate 100, and the direction Z may be referred to as a normal direction of the flexible substrate 100. The direction X and the direction Y may be parallel to the surface 100F of the flexible substrate 100. The surface 100F may be an upper surface of the flexible substrate 100, but not limited herein. The direction Z may be perpendicular to the direction X and the direction Y, and the direction X may be perpendicular to the direction Y. In addition, the direction X may be an expanding direction of a flexible display device 10. The following drawings may describe the spatial relationship of structures according the direction X, the direction Y and the direction Z.

Figure 3:
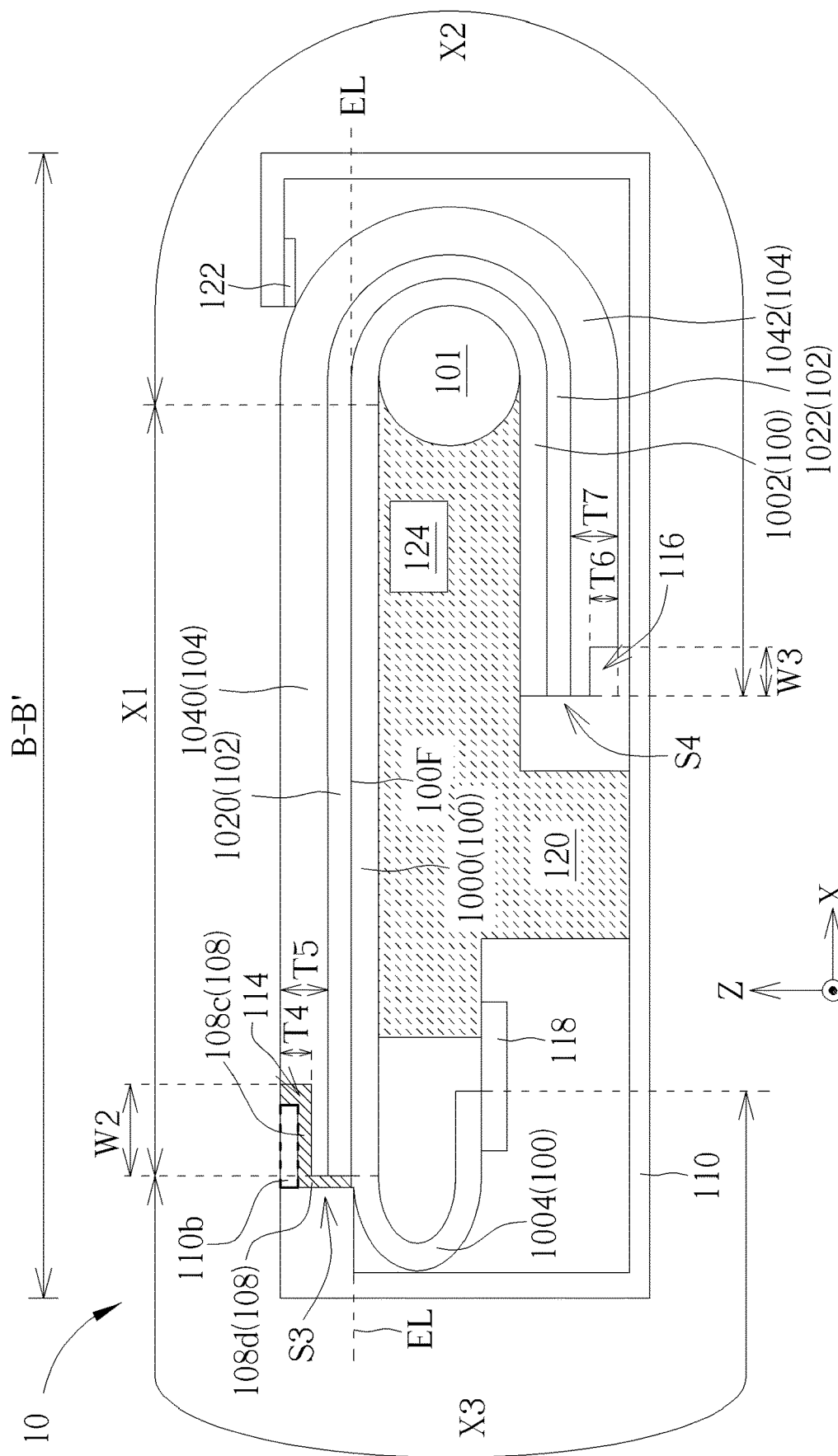
FIG. 3 is a cross-sectional view schematic diagram of the flexible display device of FIG. 1 along a section line B-B'.

Please refer to FIG. 1, FIG. 2 and FIG. 3. FIG. 1 is a top-view schematic diagram of a flexible display device in different statuses according to a first embodiment of the present disclosure. FIG. 2 is a cross-sectional view schematic diagram of the flexible display device of FIG. 1 along a section line A-A'. FIG. 3 is a cross-sectional view schematic diagram of the flexible display device of FIG. 1 along a section line B-B'. As shown in FIG. 1, a flexible display device 10 may be a rollable display device, and the flexible display device 10 may have a normal display status I and an expanded display status II. The flexible display device 10 may include a display region DR, and the area of the display region DR may be changed by folding or unfolding the flexible display device 10.

The flexible display device 10 may have a non-rollable region X1 and a rollable region X2, and the rollable region X2 is connected to a side of the non-rollable region X1, for example. The area of the non-rollable region X1 when viewed from the top-view direction (i.e., the direcion Z) is fixed and constant, and the rollable region X2 may be folded or unfolded, for example, by a rotating element 101 (shown in FIG. 3), but not limited herein. The area of the display region DR may be changed according to the folding or unfolding of the rollable region X2. As shown in FIG. 1, the status while the rollable region X2 of the flexible display device 10 being totally folded (or may be referred to FIG. 3) may be defined as the normal display status I, and the status while the rollable region X2 of the flexible display device 10 being at least partially unfolded may be defined as the expanded display status II. The expanded display status II may include the status that the rollable region X2 is partially unfolded, the status that the rollable region X2 is mostly unfolded or the status that the rollable region X2 is totally unfolded. As shown in FIG. 1, the area of the display region DR of the flexible display device 10 in the extended display status II is greater than the area of the display region DR in the normal display status I.

Figure 10:
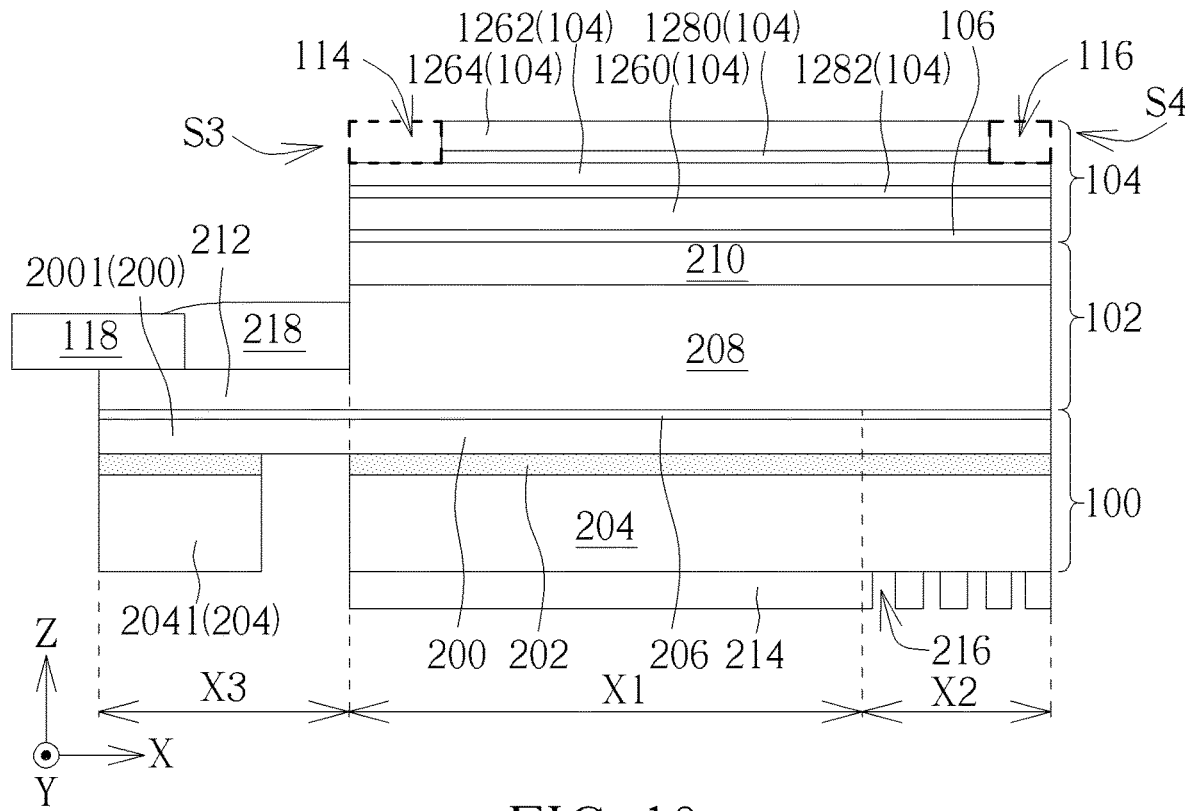

As shown in FIG. 2, the flexible display device 10 may include a flexible substrate 100, a display structure 102, a protective structure 104, an adhesive 106, one or plural adhesive(s) 108 and a housing 110. The definitions of the flexible substrate 100, the display structure 102 and the protective structure 104 will be detailed later (as shown in FIG. 10 and related paragraphs). The flexible substrate 100, the display structure 102, the protective structure 104, the adhesive 106 and the adhesive 108 may be at least partially accommodated in the housing 110. The display structure 102 may be disposed on the flexible substrate 100, the protective structure 104 may be disposed on the display structure 102, and the display structure 102 may be disposed between the flexible substrate 100 and the protective structure 104. The adhesive 106 may be disposed between the display structure 102 and the protective structure 104, so that the protective structure 104 may be attached to the display structure 102.

FIG. 2 depicts the structure of a side S1 and the other side S2 of the flexible display device 10. The structure of the side S1 of the flexible display device 10 will be described for illustration in the following, and the structure of the other side S2 may also have the same or similar technical features. The protective structure 104 may have an accommodating space 1120 at the side S1 of the flexible display device 10. For example, the side surface of the protective structure 104 (such as the side surface of the protective structure 104 in the cross-sectional view) may be recessed to form the accommodating space 1120. The term "form" means that the accommodating space of the present disclosure may be defined by the shape of the protective structure 104. In addition, the accommodating space 1120 may extend along the expanding direction (i.e., the direction X) of the flexible display device 10 in FIG. 1.

The accommodating space of the present disclosure may be defined by the following method. As shown in FIG. 2, the upper surface of the protective structure 104 may have an extended horizontal line HL1, the lower surface of the protective structure 104 may have an extended horizontal line HL2, and an extended vertical line VL may pass through the most protruded point Q on the side of the protective structure 104. The space formed by the horizontal line HL1, the horizontal line HL2, the vertical line VL and the side edge of the protective structure 104 (such as a side surface 1040 and a surface 1041) is the accommodating space 1120. The horizontal lines may be parallel to the direction Y, and the vertical line may be parallel to the direction Z, but not limited herein.

A portion 108a of the adhesive 108 and a portion 110a of the housing 110 may be disposed in the accommodating space 1120, and the portion 108a of the adhesive 108 may be disposed between the portion 110a of the housing 110 and the protective structure 104, so that the portion 110a of the housing 110 may be connected with the protective structure 104 through the portion 108a of the adhesive 108. The portion 108a of the adhesive 108 may cover or contact the side surface 1040 and the surface 1041 of the protective structure 104, but not limited herein. The portion 110a of the housing 110 may be, for example, the portion of the housing 110 that protrudes in the direction Y on the display structure 102 (as shown by the dashed frame in FIG. 2).

In addition, as shown in FIG. 2, another portion 108b of the adhesive 108 may, for example, cover or contact the side surface of a portion of the protective structure 104, the side surface of the display structure 102 and the side surface of the flexible substrate 100 under the accommodating space 1120. That is to say, the portion 108b of the adhesive 108 may be disposed between the side surface of a portion of the protective structure 104 under the accommodating space 1120 and the housing 110, between the side surface of the display structure 102 under the accommodating space 1120 and the housing 110, and between the side surface of the flexible substrate 100 under the accommodating space 1120 and the housing 110. Therefore, the housing 110 may be connected or bonded with the protective structure 104, the display structure 102 and the flexible substrate 100 through the adhesive 108.

For example, the portion 110a of the housing 110 may be used as a tenon, and the accommodating space 1120 may be used as a mortise. The portion 110a of the housing 110 may be more firmly disposed in the accommodating space 1120 by disposing the portion 108a of the adhesive 108 and the portion 110a of the housing 110 in the accommodating space 1120. Therefore, the housing 110 may be more firmly disposed on the flexible display device 10, or the probability of the housing 110 peeling off during the stretching or deformation of the flexible display device 10 may be reduced, thereby improving the reliability of the product.

A ratio of a thickness T1 of the accommodating space 1120 to a thickness T2 of the protective structure 104 may range from 0.3 to 1 ($0.3 \leq T1/T2 < 1$). That is to say, the ratio of the thickness T1 to the thickness T2 may be greater than or equal to 0.3 and less than or equal to 1. In some embodiments, the ratio of the thickness T1 to the thickness T2 may range from 0.4 to 0.8 ($0.4 \leq T1/T2 < 0.8$). That is to say, the ratio of the thickness T1 to the thickness T2 may be greater than or equal to 0.4 and less than or equal to 0.8. The thickness of the accommodating space may be the maximum thickness of the accommodating space in the direction Z in any cross-sectional view, and the thickness of the protective structure may be the maximum thickness of the protective structure in the direction Z in the same cross-sectional view.

The accommodating space 1120 may not be large enough to effectively improve the connecting strength of the housing 110 when the thickness T1 of the accommodating space 1120 is too small (e.g., $T1/T2<0.3$). When the thickness T1 of the accommodating space 1120 is too large (for example, $T1/T2 \geq 1$), the volume of the portion 110a of the housing 110 located in the accommodating space 1120 may be too large, or there may be no protective structure 104 under the portion 110a of the housing 110, so that the underlying display structure 102 may be damaged by the extrusion of the portion 110a of the housing 110.

In any cross-sectional view (as shown in FIG. 2), a width W1 of the accommodating space 1120 may range from 50 micrometers (μm) to 500 micrometers. That is to say, the width W1 of the accommodating space 1120 may be greater than or equal to 50 micrometers and less than or equal to 500 micrometers (50 μm≤the width W1≤500 μm). The width W1 of the accommodating space 1120 is the maximum width of the accommodating space 1120 in the direction Y in any cross-sectional view. The accommodating space 1120 may not be large enough to effectively improve the connecting strength of the housing 110 when the width W1 of the accommodating space 1120 is too small (e.g., the width W1<50 μm). The flexible display device 10 may not be able to achieve the narrow bezel design when the width W1 of the accommodating space 1120 is too large (e.g., the width W1>500 μm).

The structure of the side S2 of the flexible display device 10 will be described for illustration, and the structure of the other side S1 may also have the same or similar technical features. In any cross-sectional view (as shown in FIG. 2), a length L1 of a side profile of the flexible display device 10 may be greater than a thickness T3 of the flexible display device 10. The side profile of the flexible display device 10 may include the profile formed by the side edges of each layer or element in FIG. 2, and the side profile may be flat or uneven, but not limited herein. The length L1 may be the length of the side profile of the flexible display device 10 in FIG. 2. The thickness T3 may be the maximum thickness of the flexible display device 10 in the direction Z in FIG. 2, such as the maximum distance in the direction Z between the lower surface of the flexible substrate 100 and the upper surface of the protective structure 104. The upper surface of the protective structure 104 may be, for example, a surface that can be touched by a user or an object.

When the side profile is uneven, the length L1 of the side profile is greater than the thickness T3 of the flexible display device 10, and the connecting strength of the housing 110 may be improved. In some embodiments, a ratio of the length L1 of the side profile to the thickness T3 of the flexible display device 10 may range from 1.1 to 6 ($1.1 \leq L1/T3 < 6$). That is to say, the ratio of the length L1 of the side profile to the thickness T3 of the flexible display device 10 may be greater than or equal to 1.1 and less than 6. In some embodiments, the ratio of the length L1 of the side profile to the thickness T3 of the flexible display device 10 may range from 1.1 to 2.5 ($1.1 \leq L1/T3 < 2.5$). That is to say, the ratio of the length L1 of the side profile to the thickness T3 of the flexible display device 10 may be greater than or equal to 1.1 and less than 2.5. In some embodiments, the difference between the length L1 of the side profile and the thickness T3 of the flexible display device 10 may range from 50 micrometers to 500 micrometers ($50 \mu m \leq L1-T3 < 500 \mu m$). That is to say, the difference between the length L1 of the side profile and the thickness T3 of the flexible display device 10 may be greater than or equal to 50 micrometers and less than 500 micrometers. The degree of roughness of the side profile is too large when the ratio or difference described above is higher than the range, so that the connecting strength of the housing 110 is reduced instead. The degree of roughness of the side profile is too small when the ratio or difference described above is lower than the range, so that the improvement effect of the connecting strength of the housing 110 is not obvious.

FIG. 3 depicts the structure of a side S3 and the other side S4 of the flexible display device 10. For the simplicity of the drawing, the adhesive 106 in FIG. 2 is omitted in FIG. 3. As shown in FIG. 3, the flexible substrate 100 may include a non-rollable portion 1000, a rollable portion 1002 and a bending portion 1004. The non-rollable portion 1000 may be disposed between the rollable portion 1002 and the bending portion 1004. The position of the bending portion 1004 may correspond to the side S3 of the flexible display device 10, and the position of the rollable portion 1002 may correspond to the other side S4 of the flexible display device 10.

The rollable portion 1002 and the bending portion 1004 may be defined by the following method. The non-rollable portion 1000 of the flexible substrate 100 may have a relatively flat upper surface (such as the surface 100F), and an extension line EL may pass through the upper surface described above. A portion of the flexible substrate 100 that is lower than the extension line EL and fixed and immovable after bending is defined as the bent portion 1004. A portion of the flexible substrate 100 that is lower than the extension line EL and movable after bending is defined as the rollable portion 1002. The bending portion 1004 may be, for example, a portion that electrically connects a circuit element 118 with an auxiliary mechanism 120 after the substrate 100 is bent, and the circuit element 118 may not need to be shifted during using after being fixed. For example, the rollable portion 1002 may be folded or unfolded after bending according to the situation since the flexible substrate 100 has different requirements for the area of the display region DR under different using conditions, so the rollable portion 1002 may still be movable after bending. This definition method may also be applied to the following display structure 102 and protective structure 104.

The display structure 102 may include a non-rollable portion 1020 and a rollable portion 1022, and the protective structure 104 may include a non-rollable portion 1040 and a rollable portion 1042. The non-rollable portion 1000, the non-rollable portion 1020 and the non-rollable portion 1040 may be disposed in the non-rollable region X1 of the flexible display device 10, the rollable portion 1002, the rollable portion 1022 and the rollable portion 1042 may be disposed in the rollable region X2 of the flexible display device 10, and the bending portion 1004 may be disposed in a bending region X3 of the flexible display device 10. The non-rollable region X1 may be disposed between the bending region X3 and the rollable region X2, but not limited herein.

The bending portion 1004 of the flexible substrate 100 may be bent to the back side of the non-rollable portion 1000 (i.e., the side of the non-rollable portion 1000 farther from the non-rollable portion 1020). The rollable portion 1002 of the flexible substrate 100, the rollable portion 1022 of the display structure 102 and the rollable portion 1042 of the protective structure 104 may be at least partially bent to the back side of the non-rollable portion 1000 (as shown in the normal display status I of FIG. 1). In addition, the rollable portion 1002, the rollable portion 1022 and the rollable portion 1042 may be pulled out, so that the rollable portion 1002, the rollable portion 1022, the rollable portion 1042, the non-rollable portion 1000, the non-rollable portion 1020 and the non-rollable portion 1040 may display images (as shown in the expanded display status II of FIG. 1 or FIG. 10).

In some embodiments, the rollable portion 1002, the rollable portion 1022, the rollable portion 1042, the non-rollable portion 1000, the non-rollable portion 1020 and the non-rollable portion 1040 may be substantially on the same plane, but not limited herein. In other embodiments, the rollable portion 1002, the rollable portion 1022, the rollable portion 1042, the non-rollable portion 1000, the non-rollable portion 1020 and the non-rollable portion 1040 may be substantially located on the same curved surface, but not limited herein.

The protective structure 104 may have an accommodating space 114 at the side S3 of the flexible display device 10, and the protective structure 104 may have an accommodating space 116 at the other side S4 of the flexible display device 10. For example, the side surface of the protective structure 104 (or such as the side surface of the protective structure 104 in any cross-sectional view) may be recessed to form the accommodating space 114 and/or the accommodating space 116. In addition, the accommodating space 114 and/or the accommodating space 116 may extend along the direction Y in FIG. 1, and this extending direction may be perpendicular to the expanding direction (i.e., the direction X).

As shown in FIG. 3, a portion 108c of the adhesive 108 and a portion 110b of the housing 110 may be disposed in the accommodating space 114, and the portion 108c of the adhesive 108 may be disposed between the portion 110b of the housing 110 and the protective structure 104, so that the portion 110b of the housing 110 may be connected with the protective structure 104 through the portion 108c of the adhesive 108. For example, the portion 110b of the housing 110 may be used as a tenon, and the accommodating space 114 may be used as a mortise. By disposing the portion 108c of the adhesive 108 and the portion 110b of the housing 110 in the accommodating space 114, the housing 110 may be more firmly disposed on the flexible display device 10, or the probability of the housing 110 peeling off during the stretching or deformation of the flexible display device 10 may be reduced, thereby improving the reliability of the product. The portion 110b of the housing 110 may be, for example, the portion of the housing 110 that protrudes in the direction X on the display structure 102 (as shown by the dashed frame in FIG. 3).

In addition, the another portion 108d of the adhesive 108 may cover or contact the side surface of a portion of the protective structure 104 and the side surface of the display structure 102 under the accommodating space 114, and may not cover or contact the side surface of the flexible substrate 100 (such as the side surface of the bending portion 1004). The portion 108d of the adhesive 108 may be disposed between the side surface of a portion of the protective structure 104 under the accommodating space 114 and the housing 110, and between the side surface of the display structure 102 under the accommodating space 114 and the housing 110, but not limited herein.

Since the rollable portion 1042 of the protective structure 104 is movable, there may be no adhesive 108 disposed in the accommodating space 116, or the rollable portion 1042 may not be bonded to the housing 110. In some embodiments, the rollable portion 1042 of the protective structure 104 may not have the accommodating space 116.

The range of a ratio of a thickness T4 of the accommodating space 114 to a thickness T5 of the protective structure 104 (and/or the range of a ratio of a thickness T6 of the accommodating space 116 to a thickness T7 of the protective structure 104) may be the same as the range of the ratio of the thickness T1 of the accommodating space 1120 to the thickness T2 of the protective structure 104, and will not be described redundantly herein.

In any cross-sectional view (as shown in FIG. 3), a width W2 of the accommodating space 114 or a width W3 of the accommodating space 116 may range from 50 micrometers to 500 micrometers (50 μm≤the width W2 or the width W3≤500 μm). That is to say, the width W2 of the accommodating space 114 or the width W3 of the accommodating space 116 may be greater than or equal to 50 micrometers and less than or equal to 500 micrometers. The width W2 of the accommodating space 114 is the maximum width of the accommodating space 114 in the direction X in any cross-sectional view, and the width W3 of the accommodating space 116 is the maximum width of the accommodating space 116 in the direction X in any cross-sectional view.

Since the side S4 of the flexible display device 10 is rollable, and the side S3 of the flexible display device 10 is fixed, the side S3 of the flexible display device 10 will bear greater stress while rolling. In some embodiments, the width W2 of the accommodating space 114 may be greater than the width W3 of the accommodating space 116. In some embodiments, the width W2 of the accommodating space 114 may be different from the width W1 of accommodating space 1120. In some embodiments, the width W2 of the accommodating space 114 may be greater than the width W1 of the accommodating space 1120. These designs may improve the connecting strength of the housing 110, or reduce the probability of the housing 110 peeling off during the stretching or deformation of the flexible display device 10, thereby improving the reliability of the product.

Figure 9:
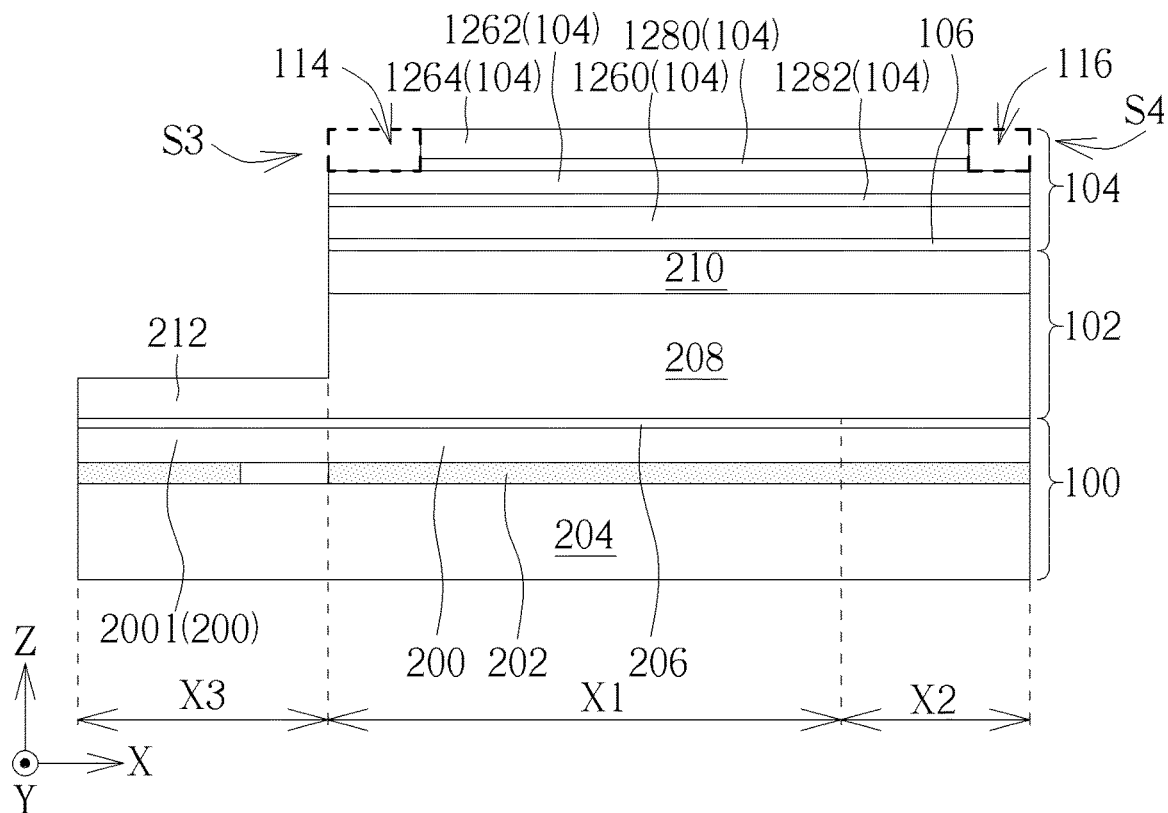
FIG. 9 and FIG. 10 are schematic diagrams of a manufacturing method of a flexible display device according to a seventh embodiment of the present disclosure.

The flexible substrate 100 may include polyimide (PI), polyethylene terephthalate (PET), other suitable materials or any combination of the above, but not limited herein. In some embodiments (as shown in FIG. 9 or FIG. 10), the flexible substrate 100 may further include a carrier substrate, a supporting film, a supporting plate, a buffer layer, other suitable layers or any combination of the above, but not limited herein. The definition of the flexible substrate 100 of the present disclosure will be detailed in FIG. 10 and related paragraphs.

The display structure 102 may include light-emitting elements, touch elements, active elements used for driving the light-emitting elements or the touch elements, passive elements, electrodes or signal lines, an encapsulation layer, an optical layer, other suitable elements or any combination of the above, but not limited herein. The optical layer may include one or plural layer(s) which may adjust optical characteristics, such as an anti-reflection layer, a polarizing plate, etc., but not limited herein. The definition of the display structure 102 of the present disclosure will be detailed in FIG. 10 and related paragraphs.

The protective structure 104 may include one or plural layer(s). The material of the layer in the protective structure 104 may include polyethylene terephthalate, polymethylmethacrylate (PMMA), ultra thin glass (UTG), colorless polyimide (CPI), hard coating, other suitable materials or any combination of the above, but not limited herein. In some embodiments, the outermost layer of the protective structure 104 may include a cover glass, but not limited herein. The definition of the protective structure 104 of the present disclosure will be detailed in FIG. 10 and related paragraphs.

The Young's modulus of the protective structure 104 may range from 1000 Mpa to 3000 Mpa (1000 Mpa≤the Young's modulus≤3000 Mpa). That is to say, the Young's modulus may be greater than or equal to 1000 Mpa and less than or equal to 3000 Mpa, but not limited herein. In some embodiments, the Young's modulus of the protective structure 104 may be about 1900 Mpa, but not limited herein. The Young's modulus of the protective structure 104 may be measured by, for example, a tensile testing machine. The length of the sample may be greater than or equal to 8 centimeters, and the width of the sample may be greater than or equal to 0.8 centimeters, but not limited herein. The test standard may include ASTM D638, ASTM D828, ASTM D882 or ISO 37, but not limited herein.

The material of the adhesive 106 or the adhesive 108 may include UV adhesive, photocurable adhesive, optically clear adhesive (OCA), optically clear resin (OCR), thermosetting adhesive, moisture curing adhesive, pressure sensitive adhesive (PSA), other suitable adhesives or any combination of the above, but not limited herein. In some embodiments, the material of the adhesive 106 or the adhesive 108 may include acrylate, cyanoacrylate or other suitable materials, but not limited herein. In some embodiments, the thickness of the adhesive 108 may range from 50 micrometers to 500 micrometers (50 μm≤the thickness<500 μm). That is to say, the thickness of the adhesive 108 may be greater than or equal to 50 micrometers and less than or equal to 500 micrometers, but not limited herein.

The housing 110 may include hard or deformable materials, and may be used to protect the flexible display device 10, but not limited herein. As shown in FIG. 3, the flexible display device 10 may further include a rotating element 101, a circuit element 118, an auxiliary mechanism 120 and a dustproof element 122.

The circuit element 118 may be connected to an end of the flexible substrate 100 (such as the bending portion 1004) and bent to the back side of the non-rollable portion 1000 along with the bending portion 1004 of the flexible substrate 100. The circuit element 118 may include an integrated circuit, but not limited herein. In some embodiments, the circuit element 118 may include a chip on film (COF) or a flexible printed circuit (FPC), but not limited herein.

The rotating element 101 may include a rolling bar, a roller or other suitable elements, but not limited herein. The rotating element 101 may be at least partially connected to the rollable portion 1002 of the flexible substrate 100, and the rollable portion 1002 of the flexible substrate 100, the rollable portion 1022 of the display structure 102 and the rollable portion 1042 of the protective structure 104 may be folded or unfolded by the rotating element 101, but not limited herein.

The auxiliary mechanism 120 may be disposed in the housing 110, and at least the non-rollable portion 1000 of the flexible substrate 100, the non-rollable portion 1020 of the display structure 102 and the non-rollable portion 1040 of the protective structure 104 may be disposed on the auxiliary mechanism 120, but not limited herein. In some embodiments, the auxiliary mechanism 120 may include a circuit board, and the circuit board may be electrically connected to the circuit element 118, but not limited herein. In some embodiments, the auxiliary mechanism 120 may include a rolling bar mechanism, the rolling bar mechanism is electrically connected to the rotating element 101 and may be used to drive the rotating element 101, but not limited herein.

The dustproof element 122 may be disposed inside the housing 110, and may be disposed adjacent to or within the rollable region X2 of the flexible display device 10. The dustproof element 122 may include fibers, but not limited herein. The dustproof element 122 may be in contact with the surface of the rollable portion 1042 of the protective structure 104 to reduce the probability of dust entering the flexible display device 10, but not limited herein.

In some embodiments, the flexible display device 10 may optionally include a sensor 124. The sensor 124 may be used to detect the position of the housing 110 and/or the rotating element 101, or to detect the folded or unfolded status of the flexible display device 10. The sensor 124 may be disposed in the auxiliary mechanism 120, on the flexible substrate 100 or at any suitable position in the flexible display device 10. The sensor 124 may include an optical sensor, a resistive sensor, a magnetic sensor, other suitable sensors or any combination of the above, but not limited herein.

Some embodiments of the present disclosure will be disclosed in the following. In order to simplify the illustration, the same elements in the following would be labeled with the same symbol. For clearly showing the differences between various embodiments, the differences between different embodiments are described in detail below, and repeated features will not be described redundantly. The flexible display devices of the following embodiments may achieve the effects of the flexible display device described in the first embodiment.

Figure 4:
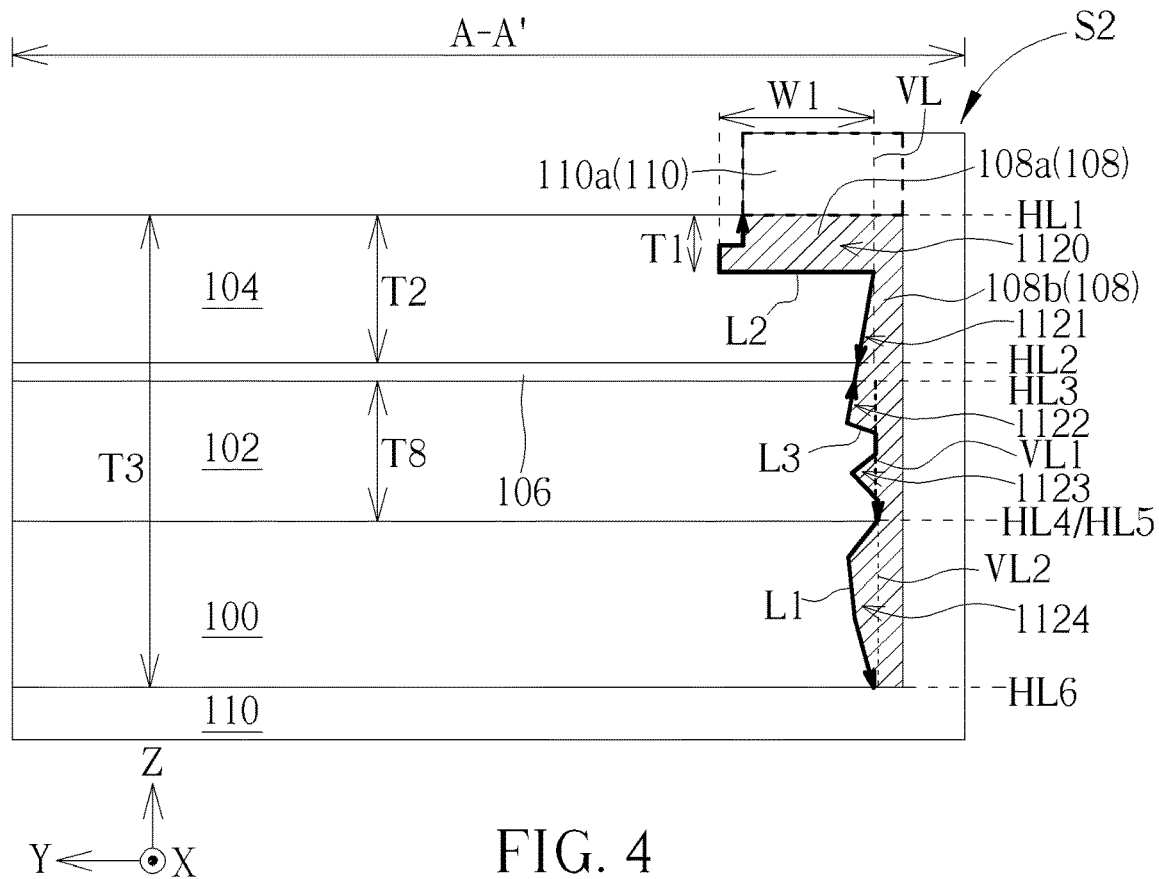
FIG. 4 is a cross-sectional view schematic diagram of a flexible display device according to a second embodiment of the present disclosure along the section line A-A'.

Please refer to FIG. 4, which is a cross-sectional view schematic diagram of a flexible display device according to a second embodiment of the present disclosure along the section line A-A'. Although FIG. 4 only shows the structure of a side S2 of a flexible display device 10, the technical features in FIG. 4 may further be applied to the structure of a side S1 or a side S3 of the flexible display device 10. The difference between this embodiment and the first embodiment (as shown in FIG. 2) is that a side profile of the flexible display device 10 of this embodiment may be uneven, which may improve the connecting strength of the housing 110.

FIG. 4 is used as an example for illustration in the following, but the structure of the flexible display device 10 is not limited to FIG. 4. According to the definition method of the accommodating space described in the first embodiment, an accommodating space 1120 and an accommodating space 1121 may be formed by a horizontal line HL1 and a horizontal line HL2 of the protective structure 104, a vertical line VL of the most protruded point on the side edge of the protective structure 104 and the side edge of the protective structure 104. The largest accommodating space (such as the accommodating space 1120) may be used as the basis for calculating the thickness or the width when a layer may form a plurality of accommodating spaces.

Similarly, an accommodating space 1122 and an accommodating space 1123 may be formed by a horizontal line HL3 of the upper surface of the display structure 102, a horizontal line HL4 of the lower surface of the display structure 102, a vertical line VL1 of the most protruded point on the side edge of the display structure 102 and the side edge of the display structure 102. An accommodating space 1124 may be formed by a horizontal line HL5 of the upper surface of the flexible substrate 100, a horizontal line HL6 of the lower surface of the flexible substrate 100, a vertical line VL2 of the most protruded point on the side edge of the flexible substrate 100, and the side edge of the flexible substrate 100. The number of accommodating spaces is not limited to the above. In some embodiments, the most protruded point on the side edge of the protective structure 104, the most protruded point on the side edge of the display structure 102 and the most protruded point on the side edge of the flexible substrate 100 may have the same or different vertical lines, which are not limited.

In this embodiment, a portion 108a of the adhesive 108 may be disposed in the accommodating space 1120 and fill-up the accommodating space 1120, and another portion 108b of the adhesive 108 may be filled in the accommodating space 1121, the accommodating space 1122, the accommodating space 1123 and the accommodating space 1124, thereby improving the connecting strength of the housing 110. In addition, a portion 110a of the housing 110 may be disposed outside the accommodating space 1120 and above the portion 108a of the adhesive 108 in this embodiment, but not limited herein.

In this embodiment, the roughness of the side surface of the protective structure 104 (or the side edge in the cross-sectional view) may be greater than the roughness of the side surface of the display structure 102. In some embodiments, a ratio of a length L2 of a side profile of the protective structure 104 (such as the length of the side edge of the protective structure 104 in FIG. 4) to a thickness T2 of the protective structure 104 may range from 1.8 to 6 (1.8≤L2/T2<6). That is to say, the ratio of the length L2 of the side profile of the protective structure 104 to the thickness T2 of the protective structure 104 may be greater than or equal to 1.8 and less than 6. In some embodiments, the ratio of the length L2 of the side profile of the protective structure 104 to the thickness T2 of the protective structure 104 may range from 1.8 to 2.5 (1.8≤L2/T2<2.5). That is to say, the ratio of the length L2 of the side profile of the protective structure 104 to the thickness T2 of the protective structure 104 may be greater than or equal to 1.8 and less than 2.5. In some embodiments, a ratio of a length L3 of a side profile of the display structure 102 (such as the length of the side edge of the display structure 102 in FIG. 4) to a thickness T8 of the display structure 102 may range from 1 to 1.7 (1≤L3/T8<11.7). That is to say, the ratio of the length L3 of the side profile of the display structure 102 to the thickness T8 of the display structure 102 may be greater than or equal to 1 and less than 11.7.

In addition, the ratio of the length L2 of the side profile of the protective structure 104 to the thickness T2 of the protective structure 104 may be greater than the ratio of the length L3 of the side profile of the display structure 102 to the thickness T8 of the display structure 102. Since the length of the side profile of the layer may represent the roughness of the side surface, the roughness of the side surface of the protective structure 104 may be greater than the roughness of the side surface of the display structure 102. Since the mechanical strength of the protective structure 104 is stronger and electronic elements are less likely to be disposed in the protective structure 104, the roughness of the side surface of the protective structure 104 may be designed to be larger, so as to increase the connecting strength of the housing 110. Since there are more electronic elements disposed in the display structure 102, the roughness of the side surface of the display structure 102 may be designed to be smaller, so as to reduce the damage probability of the electronic elements on the edge in the display structure 102.

Figure 5:
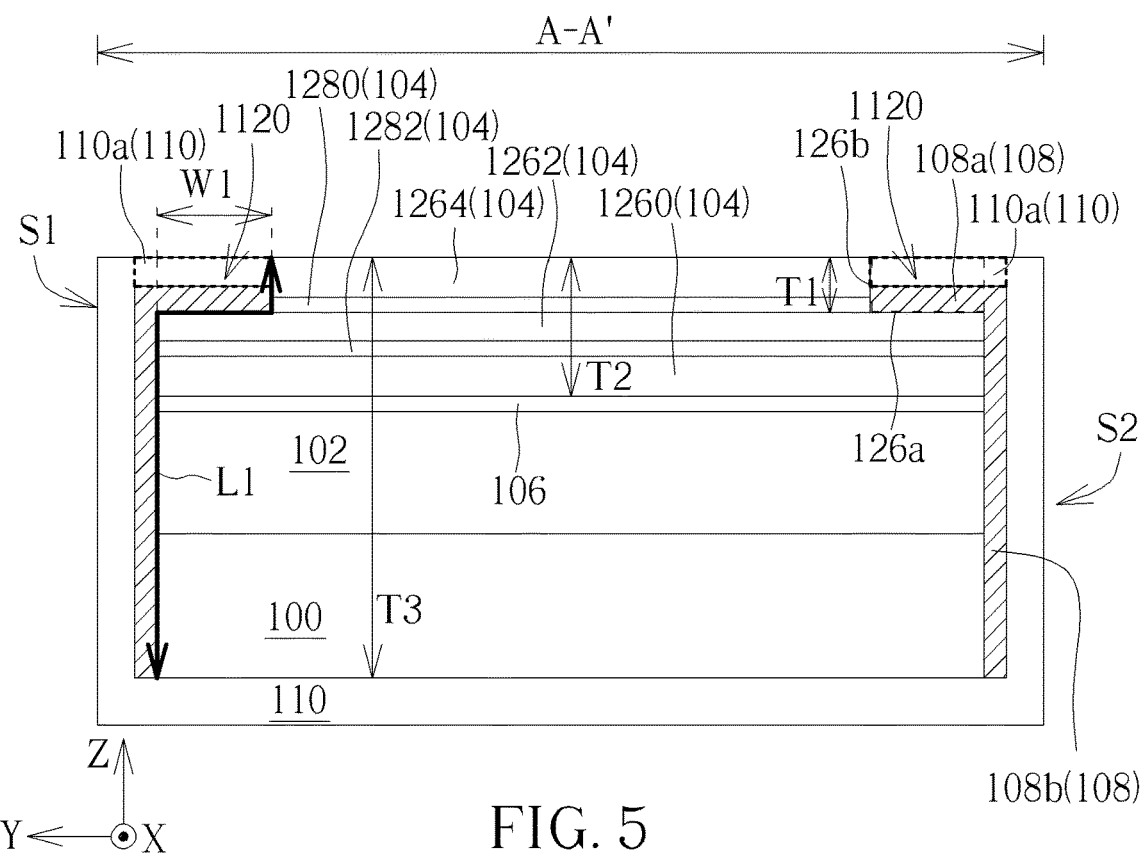
FIG. 5 is a cross-sectional view schematic diagram of a flexible display device according to a third embodiment of the present disclosure along the section line A-A'.

Please refer to FIG. 5, which is a cross-sectional view schematic diagram of a flexible display device according to a third embodiment of the present disclosure along the section line A-A'. Although FIG. 5 only shows the structure of a side S1 and a side S2 of a flexible display device 10, the technical features in FIG. 5 may further be applied to the structure of a side S3 of the flexible display device 10. The difference between this embodiment and the first embodiment (as shown in FIG. 2) is that the protective structure 104 may include a multi-layered structure.

The protective structure 104 may include a protective layer 1260, a protective layer 1262 and a protective layer 1264. The protective layer 1262 may be disposed between the protective layer 1260 and the protective layer 1264, and the number of protective layers is not limited to that shown in FIG. 5. The width of the protective layer 1264 may be less than the width of the protective layer 1260 and/or the width of the protective layer 1262, so that the side surface of the protective layer 1264 (such as the side edge of the protective layer 1264 in the cross-sectional view) may be recessed to form the accommodating space 1120. The materials of the protective layer 1260, the protective layer 1262 and the protective layer 1264 may be the same or different from each other. In some embodiments, the material of the protective layer 1262 may include colorless polyimide, and the materials of the protective layer 1260 and the protective layer 1264 may include polyethylene terephthalate, but not limited herein.

The protective structure 104 may include an adhesive 1280 and an adhesive 1282, but the number of adhesives is not limited to that of FIG. 5. The adhesive 1280 may be disposed between the protective layer 1264 and the protective layer 1262, the adhesive 1282 may be disposed between the protective layer 1262 and the protective layer 1260, and the adhesive 106 may be disposed between protective layer 1260 and display structure 102.

A portion 108a of the adhesive 108 and a portion 110a of the housing 110 may be disposed in the accommodating space 1120, so that the portion 110a of the housing 110 may be connected with the protective structure 104 through the portion 108a of the adhesive 108. The difference between this embodiment and the first embodiment (as shown in FIG. 2) is that the portion 108a of the adhesive 108 of this embodiment may cover or contact an upper surface 126a of the protective layer 1262, and may cover or contact a side surface 126b of the protective layer 1264, or may not completely cover the side surface 126b of the protective layer 1264, but not limited herein.

The portion 108a of the adhesive 108 and the adhesive 1280 may be both disposed on the upper surface 126a of the protective layer 1262, but the thickness of the portion 108a of the adhesive 108 may be different from the thickness of the adhesive 1280. As shown in FIG. 5, the thickness of the portion 108a of the adhesive 108 may be greater than the thickness of the adhesive 1280. In some embodiments, the thickness of the portion 108a of the adhesive 108 may range from 50 micrometers to 500 micrometers (50 μm≤the thickness≤500 μm). That is to say, the thickness of the portion of the adhesive 108 may be greater than or equal to 50 micrometers and less than or equal to 500 micrometers, but not limited herein. In some embodiments, the thickness of the adhesive 1280 may range from 10 micrometers to 50 micrometers (10 μm≤the thickness≤50 μm). That is to say, the thickness of the adhesive 1280 may be greater than or equal to 10 micrometers and less than or equal to 50 micrometers, but not limited herein.

The portion 108a of the adhesive 108 and the portion 110a of the housing 110 may bear greater stress when the flexible display device 10 is stretched or deformed. Therefore, by increasing the thickness of the adhesive 108, the connecting strength of the housing 110 may be improved, and the probability of the housing 110 peeling off may be reduced. The materials of the adhesive 1280 and the adhesive 1282 may be referred to the materials of the adhesive 106 or the adhesive 108 described above, and will not be described redundantly herein. The materials of the adhesive 1280, the adhesive 1282, the adhesive 106 and the adhesive 108 may be the same or different, which are not limited.

Figure 6:
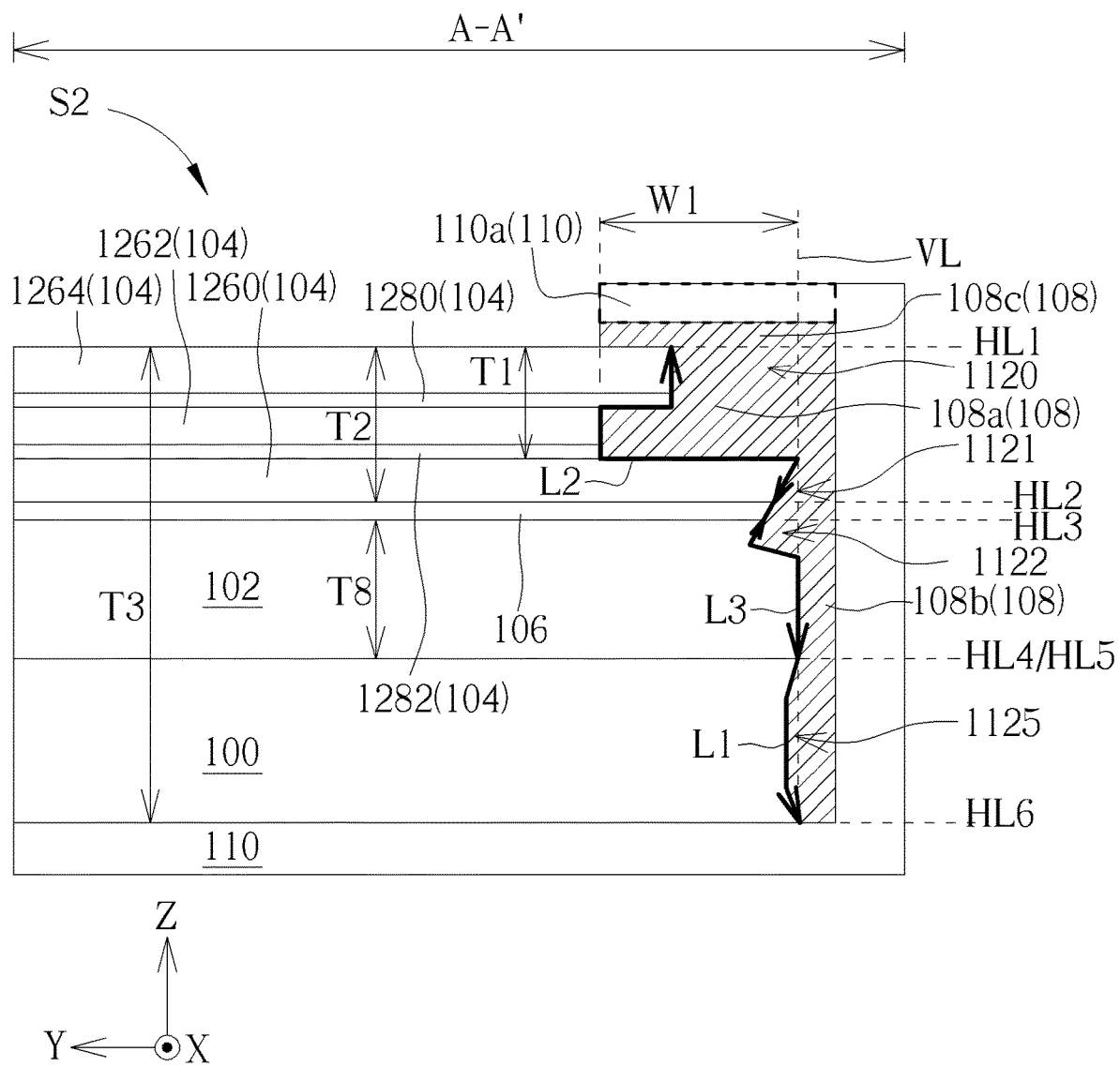
FIG. 6 is a cross-sectional view schematic diagram of a flexible display device according to a fourth embodiment of the present disclosure along the section line A-A'.

Please refer to FIG. 6, which is a cross-sectional view schematic diagram of a flexible display device according to a fourth embodiment of the present disclosure along the section line A-A'. Although FIG. 6 only shows the structure of a side S2 of a flexible display device 10, the technical features in FIG. 6 may further be applied to the structure of a side S1 or a side S3 of the flexible display device 10. The difference between this embodiment and the third embodiment (as shown in FIG. 5) is that a side profile of the flexible display device 10 of this embodiment may be uneven, which may improve the connecting strength of the housing 110.

As shown in FIG. 6, the width of the protective layer 1264 may be less than the width of the protective layer 1260, and the width of the protective layer 1262 may be less than the width of the protective layer 1264, so that the side surfaces of the protective layer 1264 and the protective layer 1262 (such as the side edges of the protective layer 1264 and the protective layer 1262 in the cross-sectional view) may be recessed to form the accommodating space 1120.

Similar to the third embodiment, the materials of the protective layer 1260, the protective layer 1262 and the protective layer 1264 may be the same or different from each other in this embodiment. In some embodiments, the material of the protective layer 1262 may include ultra thin glass, and the materials of the protective layer 1260 and the protective layer 1264 may include polyethylene terephthalate, but not limited herein. Since the ultra thin glass is easier to crack under stress, the width of the protective layer 1262 is designed to be narrower to reduce the chance of cracking the protective layer 1262.

Similar to the second embodiment, the accommodating space 1120 and the accommodating space 1121 may be formed by the horizontal line HL1 of the upper surface of the protective layer 1264 and the horizontal line HL2 of the lower surface of the protective layer 1260, the vertical line VL of the most protruded point on the side edge of the protective structure 104 and the side edge of the protective structure 104 in this embodiment.

In addition, an accommodating space 1122 may be formed by the horizontal line HL3 of the upper surface of the display structure 102, the horizontal line HL4 of the lower surface of the display structure 102, the vertical line VL of the most protruded point on the side edge of the display structure 102 and the side edge of the display structure 102. An accommodating space 1125 may be formed by the horizontal line HL5 of the upper surface of the flexible substrate 100, the horizontal line HL6 of the lower surface of the flexible substrate 100, the vertical line VL of the most protruded point on the side edge of the flexible substrate 100 and the side edge of the flexible substrate 100. The number of accommodating spaces is not limited to the above.

Similar to the second embodiment, the roughness of the side surface of the protective structure 104 (or the side edge in the cross-sectional view) may be greater than the roughness of the side surface of the display structure 102 in this embodiment, and the effects described in the second embodiment may be achieved.

In this embodiment, a portion 108a of the adhesive 108 may be disposed in the accommodating space 1120 and fill-up the accommodating space 1120, and another portion 108b of the adhesive 108 may be filled in the accommodating space 1121, the accommodating space 1122 and the accommodating space 112. In addition, a portion 108c of the adhesive 108 may be disposed on the portion 108a (or the accommodating space 1120), and the portion 108c of the adhesive 108 may cover or contact a portion of the upper surface of the protective layer 1264. A portion 110a of the housing 110 may be disposed outside the accommodating space 1120 and above the portion 108c of the adhesive 108, so that the portion 110a of the housing 110 may also cover a portion of the upper surface of the protective layer 1264. Therefore, the connecting strength of the housing 110 may be improved.

Figure 7:
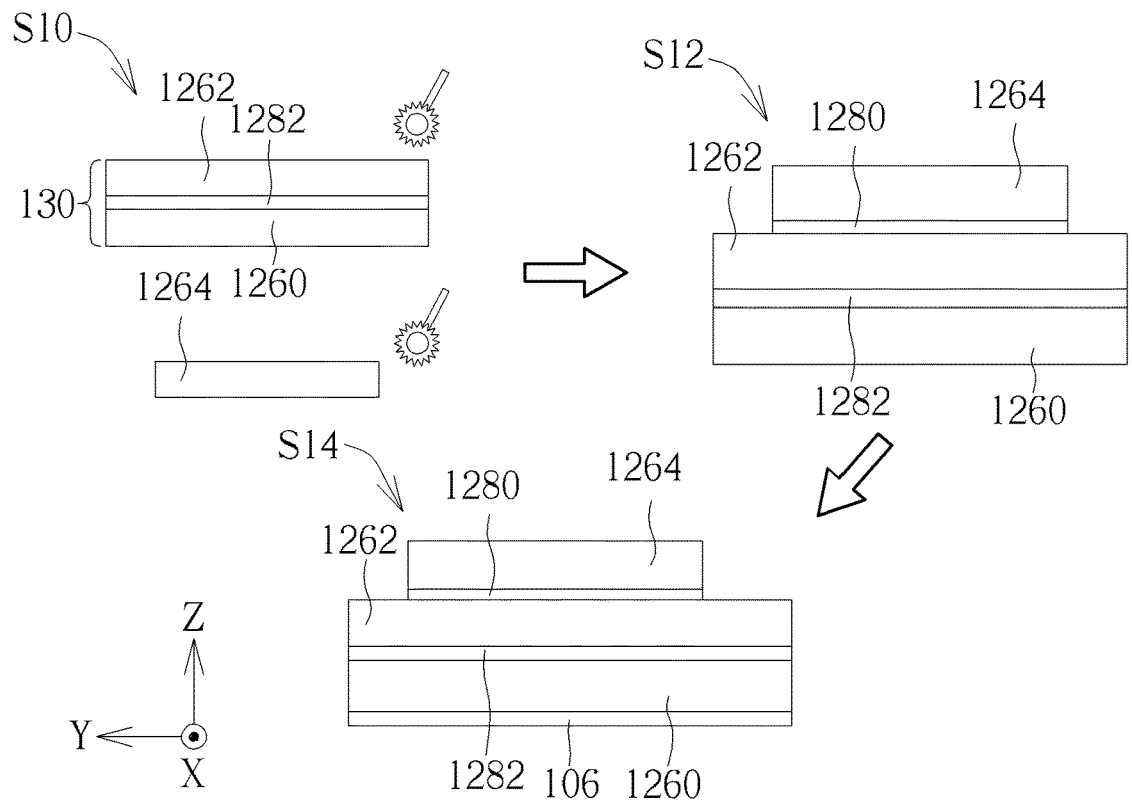
FIG. 7 is a schematic diagram of a manufacturing method of a protective structure according to a fifth embodiment of the present disclosure.

Please refer to FIG. 7, which is a schematic diagram of a manufacturing method of a protective structure according to a fifth embodiment of the present disclosure. The manufacturing method of FIG. 7 may be used to manufacture the multi-layered structure of the protective structure 104 in the third embodiment (as shown in FIG. 5), but not limited herein. First, performing a step S10, a plurality of protective plates with a large area may be provided. Two of the protective plates may be adhered by an adhesive, and then a plurality of sub-structures 130 with a small area may be obtained by performing a cutting process to the two protective plates, and each sub-structure 130 may include a protective layer 1260, a protective layer 1262 and an adhesive 1282. On the other hand, a plurality of protective layers 1264 with a small area may be obtained by performing a cutting process to another one of the protective plates, and the width of the protective layer 1264 may be less than the width of the protective layer 1260 and/or the width of the protective layer 1262. The cutting process may include wheel cutting process, laser cutting process or other suitable cutting processes, but not limited herein.

Next, performing a step S12, the protective layer 1264 and the protective layer 1262 are adhered to each other by using an adhesive 1280. Then, performing a step S14, an adhesive 106 is formed on the lower surface of the protective layer 1260. If a protective plate with a large area is firstly adhered to an uncut carrier plate having a plurality of display panels and then cut, the elements in the display panels may be damaged and the qualified rate may be reduced when the cutting process of the protective plate is performed. In this embodiment, the protective structure 104 and the display panel may be manufactured separately, thereby reducing the damage of elements in the display panel and improving the qualified rate.

Figure 8:
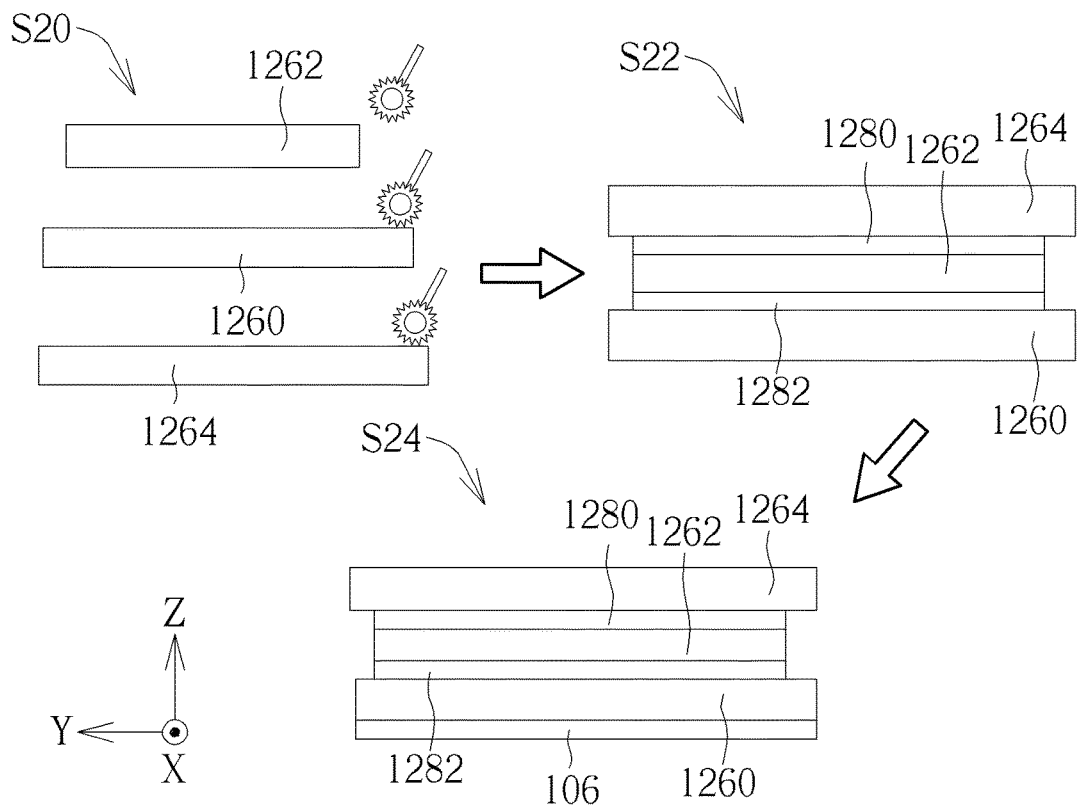
FIG. 8 is a schematic diagram of a manufacturing method of a protective structure according to a sixth embodiment of the present disclosure.

Please refer to FIG. 8, which is a schematic diagram of a manufacturing method of a protective structure according to a sixth embodiment of the present disclosure. First, performing a step S20, a plurality of protective plates with a large area may be provided, and then a plurality of protective layers 1260 with a small area, a plurality of protective layers 1262 with a small area and a plurality of protective layers 1264 with a small area may be obtained by performing a cutting process to each of the protective plates, and the width of the protective layer 1262 may be less than the width of the protective layer 1260 and/or the width of the protective layer 1264. The cutting process may include wheel cutting process, laser cutting process or other suitable cutting processes, but not limited herein.

Next, performing a step S22, the protective layer 1262 and the protective layer 1260 are adhered to each other by using an adhesive 1282, and the protective layer 1264 and the protective layer 1262 are adhered to each other by using an adhesive 1280. Then, performing a step S24, an adhesive 106 is formed on the lower surface of the protective layer 1260. The manufacturing method of the protective structure of this embodiment may also have the effects as described in the fifth embodiment.

Please refer to FIG. 9 and FIG. 10, which are schematic diagrams of a manufacturing method of a flexible display device according to a seventh embodiment of the present disclosure. As shown in FIG. 9, a flexible substrate 100 and a display structure 102 may be provided first, and then the protective structure 104 is adhered to the display structure 102 through an adhesive 106. The display structure 102 may be manufactured on the flexible substrate 100, and the display structure 102 and the protective structure 104 may be manufactured separately, but not limited herein. For example, the protective structure 104 of FIG. 9 may be formed by the manufacturing method of the fifth embodiment (as shown in FIG. 7), but not limited herein.

As shown in FIG. 9, the flexible substrate 100 may include a substrate 200, a supporting film glue 202, a supporting film 204 and a buffer layer 206, but not limited herein. The substrate 200 may be disposed on the supporting film 204 through the supporting film glue 202, and the buffer layer 206 may be disposed between the substrate 200 and the display structure 102, but not limited herein. The substrate 200 may include polyimide, polyethylene terephthalate, other suitable materials or any combination of the above, but not limited herein. The buffer layer 206 may include silicon oxide, silicon nitride, other suitable insulating materials or any combination of the above, but not limited herein.

As shown in FIG. 9, the substrate 200 of the flexible substrate 100 may include a bending portion 2001 disposed in the bending region X3, and an accommodating space 114 may not overlap the bending portion 2001 in a normal direction of the flexible substrate 100 (e.g., the direction Z), but not limited herein. In some embodiments, an accommodating space 114 may overlap or partially overlap the bending portion 2001 in a normal direction of the flexible substrate 100 (e.g., the direction Z), but not limited herein.

In some embodiments, the substrate 200 may be disposed on a carrier plate (not shown) first when the display structure 102 is manufactured on the substrate 200. After manufacturing the display structure 102, the carrier plate may be removed, and the supporting film 204 may be adhered to the substrate 200 by the supporting film glue 202, but not limited herein.

As shown in FIG. 9, the display structure 102 may include a display element layer 208, an optical layer 210 and a wiring layer 212, but not limited herein. The display element layer 208 may be disposed on the buffer layer 206, and the protective structure 104 may be disposed on the optical layer 210 through the adhesive 106. The wiring layer 212 may be disposed on the buffer layer 206, and the wiring layer 212 may extend from the display element layer 208 in the non-rollable region X1 to the bending region X3, but not limited herein.

The display element layer 208 may include light-emitting elements, touch elements, active elements used for driving the light-emitting elements or the touch elements, passive elements, electrodes or signal lines, an encapsulation layer, other suitable elements or any combination of the above, but not limited herein. The optical layer 210 may include one or plural layer(s) which may adjust optical characteristics, such as an anti-reflection layer, a polarizing plate, etc., but not limited herein. The wiring layer 212 may include signal lines, circuits, bonding pads, other suitable elements or any combination of the above, but not limited herein.

As shown in FIG. 9, a portion of the supporting film glue 202 located in the bending region X3 may be removed, and a tear line may be formed in the supporting film 204 corresponding to the edge of the bending region X3, but not limited herein. Then, as shown in FIG. 10, a portion of the supporting film 204 located in the bending region X3 and adjacent to the non-rollable region X1 may be removed to facilitate the bending of the flexible substrate 100 in subsequent steps.

Then, as shown in FIG. 10, the flexible substrate 100 may include a supporting plate 214 formed under the supporting film 204. That is to say, the supporting film 204 may be located between the supporting plate 214 and the supporting film glue 202. The supporting plate 214 may be disposed in the non-rollable region X1 and the rollable region X2. The supporting plate 214 may include a plurality of openings 216 disposed in the rollable region X2, and the openings 216 may help the flexible substrate 100 in the rollable region X2 to be rolled-up or stretched. In some embodiments, the supporting plate 214 may be formed under the supporting film 204 first, and then a portion of the supporting film 204 located in the bending region X3 and adjacent to the non-rollable region X1 may be removed.

Then, a circuit element 118 and a protective layer 218 may be formed in the bending region X3 and on the wiring layer 212. The protective layer 218 may be disposed on the wiring layer 212 and cover or contact a portion of the upper surface of the circuit element 118, and the protective layer 218 may be disposed between the circuit element 118 and the display element layer 208. The circuit element 118 may be electrically connected to the bonding pads of the wiring layer 212, but not limited herein.

Then, the flexible substrate 100, the wiring layer 212, the circuit element 118 and the protective layer 218 in the bending region X3 may be bent to the back side of the flexible display device 10 (i.e., the side away from the user). After bending, a portion 2041 of the supporting film 204 in the bending region X3 may be adhered to the supporting plate 214 through an adhesive. Alternatively, after bending, the circuit element 118 may be connected to the auxiliary mechanism 120 in FIG. 3 to obtain a structure similar to the structure of FIG. 3. Then, the housing 110 may be disposed through the adhesive 108 in FIG. 2 and/or the adhesive 108 in FIG. 3.

As shown in FIG. 10, in the present disclosure, the layers or elements from the lower surface of the supporting plate 214 to the upper surface of the buffer layer 206 along the direction Z may be defined as the flexible substrate 100, the layers or elements from the upper surface of the buffer layer 206 to the upper surface of the optical layer 210 along the direction Z may be defined as the display structure 102, and the layers or elements from the upper surface of the optical layer 210 to the upper surface of the flexible display device 10 along the direction Z may be defined as the protective structure 104. In addition, the upper surface of the flexible display device 10 may be a surface that can be touched by a user or an object.

From the above description, in flexible display device of the present disclosure, the protective structure may form one or plural accommodating space(s). For example, the accommodating space may be used as a mortise, and a portion of the housing may be used as a tenon. Furthermore, an adhesive is disposed in the accommodating space, so that a portion of the housing may be more firmly disposed on the flexible display device through the adhesive. The probability of the housing peeling off during the stretching or deformation of the flexible display device may be reduced, thereby improving the reliability of the product.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A flexible display device, comprising:
    a flexible substrate;
    a display structure disposed on the flexible substrate;
    a protective structure disposed on the display structure and forming a first accommodating space;
    a housing accommodating the flexible substrate, the display structure and the protective structure, wherein a side surface of the protective structure is recessed to form the first accommodating space, and a portion of the housing is disposed in the first accommodating space; and
    an adhesive disposed in the first accommodating space, wherein a side profile of the protective structure, a side profile of the display structure, and a side profile of flexible substrate are uneven.

2. The flexible display device as claimed in claim 1, wherein the portion of the housing is connected with the protective structure through the adhesive.

3. The flexible display device as claimed in claim 1, wherein a ratio of a thickness of the first accommodating space to a thickness of the protective structure is greater than or equal to 0.3 and less than or equal to 1.

4. The flexible display device as claimed in claim 1, wherein the protective structure comprises a multi-layered structure.

5. The flexible display device as claimed in claim 1, wherein the flexible substrate comprises a bending portion, and the first accommodating space does not overlap the bending portion in a normal direction of the flexible substrate.

6. The flexible display device as claimed in claim 1, wherein the flexible substrate comprises a bending portion, and the first accommodating space overlaps the bending portion in a normal direction of the flexible substrate.

7. The flexible display device as claimed in claim 1, wherein the flexible display device is a rollable display device.

8. The flexible display device as claimed in claim 7, wherein the flexible display device has an expanding direction, and the first accommodating space extends along a direction perpendicular to the expanding direction in a top-view.

9. The flexible display device as claimed in claim 8, wherein the protective structure further comprises a second accommodating space extending along the expanding direction in the top-view, and a first width of the first accommodating space is different from a second width of the second accommodating space.

10. The flexible display device as claimed in claim 9, wherein the first width is greater than the second width.

11. The flexible display device as claimed in claim 9, wherein the first width is greater than or equal to 50 um and less than or equal to 500 um in a cross-sectional view.

12. The flexible display device as claimed in claim 1, wherein a length of a side profile of the flexible display device is greater than a thickness of the flexible display device in a cross-sectional view.

13. The flexible display device as claimed in claim 12, wherein a ratio of the length of the side profile to the thickness of the flexible display device is greater than or equal to 1.1 and less than 6.

14. The flexible display device as claimed in claim 13, wherein a ratio of the length of the side profile to the thickness of the flexible display device is greater than or equal to 1.1 and less than 2.5.

* * * * *